(12) United States Patent
Shahinpoor et al.

(10) Patent No.: US 6,433,543 B1
(45) Date of Patent: Aug. 13, 2002

(54) SMART FIBER OPTIC MAGNETOMETER

(76) Inventors: Mohsen Shahinpoor, 9910 Tanoan NE, Albuquerque, NM (US) 87111; Sorin Gabriel Popa, 10734 Stone Hedge Ct. NW, Albuquerque, NM (US) 87114; Laurel O. Sillerud, 304 Las Colinas NE, Albuquerque, NM (US) 87113

(*) Notice: Subject to any disclaimer, the term of this patent is extended or adjusted under 35 U.S.C. 154(b) by 0 days.

(21) Appl. No.: 09/683,480

(22) Filed: Jan. 4, 2002

(51) Int. Cl.[7] ................ G01R 33/032; G01R 31/00; G02F 1/09
(52) U.S. Cl. ................ 324/244.1; 324/96; 359/280
(58) Field of Search ................ 324/244.1, 96, 324/280

(56) References Cited
U.S. PATENT DOCUMENTS 4,419,895 A * 12/1983 Fuller ............. 73/517 A
4,433,291 A * 2/1984 Yariv et al. .......... 324/244.1

* cited by examiner

*Primary Examiner*—Edward Lefkowitz
*Assistant Examiner*—Toan M Le

(57) ABSTRACT

A smart magnetometer which includes at least one cantilevered magnetostrictive/optical fiber structural bonded composite in a vibrationally isolated housing allowing an optical signal to be transmitted and detected from one optical fiber to another such that fluctuations of the surrounding magnetic field H will cause fluctuating mechanical torque on the composite magnetostrictive beam which will be applied to the bonded cantilevered optical fiber to deflect or misalign and cause modulation of the optical signal transmitted between the two fibers. This modulation can be calibrated to the dynamic variation of strength of a neighboring magnetic field to a precision and sensitivity of less than 1 fT and 1 fT/sqrtHz. The system is smart to selectively filter out any neighboring magnetic field with average strength smaller or greater than a certain critical value. The system is also smart enough to switch from one magnetic field average strength and/or direction to another with different average strength and/or direction.

14 Claims, 4 Drawing Sheets

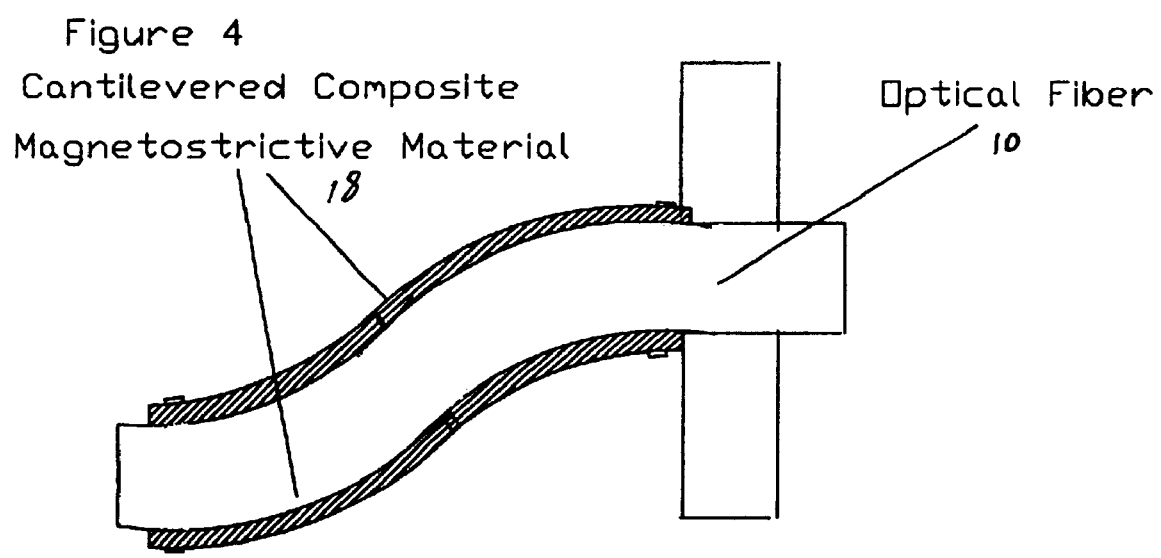

SMART FIBER OPTIC MAGNETOMETER

BACKGROUND OF INVENTION

1. Field of the Invention

This invention relates to fiber optic magnetometers that are smart enough to selectively filter out magnetic fields and variations there of and easily have an a accuracy of less than 1 fT and sensitivities of less than 1 fT/sqrtHz and more particularly to fiber optic magnetic sensors of controllable precision.

2. Prior Art

The prior art is replete with many optical fiber sensors and different variations in Fabry-Perot, Mach-Zehnder modulators or Kerr effect or other optical effect-based magnetic sensors including squid type magnetometer. All of current devices have one or more of the following disadvantages: excessive bulk, slow response, require liquid helium cryogenic temperatures and poor mechanical reliability. Here below we present some typical examples but by no means exhaustive:

It is appropriate to mention some prior art related to the field of the present invention.

U.S. Pat. No. 4,588,947, to Ketchen, issued May 1986 discusses a miniature, fully integrated susceptometer capable of measuring the magnetic properties of very small samples (<10 $\mu$m) is described which is fabricated by thin film lithography on a single chip. The susceptometer is comprised of a dc SQUID including two series wired pick-up loops into which a sample to be measured can be placed. A field coil is provided which includes a separate single turn around each of the SQUID pick-up loops. The SQUID pick-up loops and the surrounding field coil turns are both located over a hole in a superconducting ground plane.

Daalmans in U.S. Pat. No. 4,801,882, issued January 1989 discusses a SQUID magnetometer, which can be fabricated by thin-film technology and used for apparatus for measuring weak magnetic fields. It contains a d-c SQUID with a SQUID loop surrounding the effective area of a coupling hole as well as a superconducting flux transformer with a gradiometer coil and a coupling coil surrounding the coupling hole thereby to achieve an effective inductive coupling of a measuring signal into the SQUID. To this end, the invention provides a separate superconducting surface with the coupling hole, to which the coupling coil and or the SQUID loop is/are assigned.

Hubbell in U.S. Pat. No. 6,005,380, issued December 1999 describes a magnetic field sensor, which can be used as an active antenna is disclosed that is capable of small size, ultra wide band operation, and high efficiency. The sensor includes a multiplicity of magnetic field transducers, e.g., superconducting quantum interference devices (SQUIDs) or Mach-Zehnder modulators that are electrically coupled in a serial array. Dummy SQUIDs may be used about the perimeter of the SQUID array, and electrically coupled to the active SQUIDs for eliminating edge effects that otherwise would occur because of the currents that flow within the SQUIDs. Either a magnetic flux transformer, which collects the magnetic flux and distributes the flux to the transducers or a feedback assembly (bias circuit) or both may be used for increasing the sensitivity and linear dynamic range of the antenna.

Bowman, et. al., in U.S. Pat. No. 3,750,017 issued July 1973 discuss an electromagnetic field measuring device is disclosed having a response which is essentially independent of the physical orientation of the device in the electromagnetic field. Further, the response of the device is essentially independent of the polarization of the field or of the presence of reactive field components or multipath interference. A set of three antennas disposed in a mutually orthogonal relationship with an essentially common center is provided, the antennas being adapted to be placed in an electromagnetic field to be measured. Sensing means, in the form of diodes for example, are associated with each antenna for deriving a signal therefrom. In the preferred embodiment, such antennas may take the form of dipoles, and diodes are contemplated to be connected between the dipole legs. The derived signals so produced are removed from the antennas in a fashion wherein no substantial perturbation of the field to be measured occurs and without substantially affecting the electrical characteristics of the antenna set. In a preferred embodiment, a high-resistance transmission line is provided. Subsequently, the derived and removed signals are combined and processed so as to generate a measurement reading.

Odawara, et. al., in U.S. Pat. No. 5,280,242 issued February 1991, discuss an apparatus for detecting a fine magnetic field comprises a DC SQUID, which detects and converts a magnetic field to an electrical signal. A flux locked looped circuit drives the DC SQUID. The flux locked loop circuit includes an amplifier for amplifying the electrical signal. A phase detector modulates the amplified electrical signal and an integration circuit outputs a voltage signal corresponding to the detected magnetic field. An oscillator coupled to the phase detector supplies a demodulation frequency signal. A modulator including a first voltage-to-current converter and a second voltage-to-current converter is coupled with the integration circuit and the oscillator for supplying a modulation signal to the DC SQUID. The modulator further includes an external input terminal and a feedback modulation change-over circuit for changing an internal feedback signal to an external test signal inputted to the external input terminal. A bias source having a third voltage-to-current converter is coupled to the DC SQUID and supplies a bias signal. The bias source also includes an external input terminal and a change-over circuit for changing an internal bias. signal to an external test signal inputted to the second external input terminal.

Crum, et. al., in U.S. Pat. No. 4,793,355 issued December 1988, discuss a biomagnetometer for measuring magnetic fields produced by the body and an electromagnetic location measurement and recording system for automatically determining the location of the portion of the body from which the magnetic signals are being gathered. The electromagnetic location recording system permits establishing a real time body frame of reference with respect to the biomagnetometer, so that biomagnetic signals can be correlated directly with body location and structure. The electromagnetic location recording system may be operated continuously at radiation wavelengths, which do not interfere with the taking of data, or intermittently with the taking of biomagnetic data, to avoid interference with the measured values of the biomagnetic data. The elements of the electromagnetic location recording system have substantially no residual magnetism when the location recording system is not operating, as the biomagnetic signals are typically so small that even normal residual magnetism might be erroneously recorded as a biomagnetic signal.

Johnson, et. al., in U.S. Pat. No. 5,444,373 issued August 1995, discuss a biomagnetometer comprising an array of biomagnetic sensors, the array comprising a first plurality of magnetic field pickup coils, and a second plurality of detectors, each of which receives a pickup coil output from a pickup coil. There is a third plurality of signal processors, each of which receives an output from a detector, the third plurality of signal processors being fewer in number than the first plurality of pickup coils. The biomagnetometer further includes a selector that selects a subset of pickup coils, equal in number to the third plurality of signal processors, from the first plurality of pickup coils for signal processing by the signal processors. This biomagnetometer permits the placement of a very large array of relatively inexpensive pickup coils adjacent to a subject, and then processing information from subsets of that large array selected to optimize the gathering of data, while maintaining the cost of the signal processing electronics at a more economical level.

Robinson, et. al., in U.S. Pat. No. 4,977,896 issued December 1990, discuss how signals produced by brain activity are measured by each sensor of an array of magnetic and/or electrical sensors external to but proximate to the head (or other portion of the body) of a subject. The measurements obtained simultaneously from all of the sensors are combined in a manner to permit selective measurement of the electrical activity from a specified location within the body, or alternatively, to permit the location in the body producing a particular type of response to be identified. The instantaneous measurement of each sensor is scaled by a weighting coefficient for that sensor, and the products added over all of the sensors. The weighting coefficients are calculated from a mathematical model of the brain that includes information on the shape of the potential source, the extent or type of source activity, the electrical and magnetic properties of the media, and the locations and orientations of the sources and the sensors.

Tsukada, et. al., in U.S. Pat. issued May 2001, discuss a biomagnetic field measuring apparatus that has a plurality of flux meters disposed externally of a living body and each including a superconducting quantum interference device (SQUID) for detecting a biomagnetic field generated from the living body, the plurality of flux meters being operative to detect a temporal change of a component of the biomagnetic field in a first direction which is normal to the surface of the living body, an operation processor for performing computation for determining a temporal change of a value proportional to a root of square sum of differential values of the first-direction magnetic field component in second and third directions which cross the first direction and computation for integrating the temporal change of the value over a predetermined interval to determine an integral value, and a display for displaying the determined integral value. Distribution of magnetic fields generated from the heart is determined with a small number of flux meters. Based on the above description it can be observed that this device is SQUID based and therefore is different from our presented invention.

Kuc, et. al., in U.S. Pat. No. 5,594,849 issued January 1997, discuss a method and apparatus for performing biomagnetic imaging to determine the location and intensity of current sources within a subject, which includes a sensor unit for sensing the magnetic field within the subject and for providing sensing signals. A signal processor defines a grid having multiple grid points and performs inverse estimation to determine the distribution of current sources on the defined grid based on the sensing signals. The signal processor then modifies the grid to improve the resolution of the current sources distributed on the grid. A control unit controls the operation of the signal processor and processes image data to provide magnified and non-magnified displays on a display unit. The biomagnetic imaging method and apparatus can be combined with a system for providing magnetic resonance imaging data so as to produce a superimposed display including an MRI image and a biomagnetic image.

U.S. Pat. No. 4,368,430 by Dale, et al. Jan. 11, 1983 entitled "Fiber optic magnetic sensors" which basically discussed A magnetometer which includes a pair of spaced apart optical fibers at least one of which comprises a cantilevered beam having a dipolar magnet thereon such that fluctuations of the magnetic H field will cause fluctuating mechanical torque on the magnet which will be applied to the cantilevered optical fiber to deflect same and occasion modulation of an optical signal transmitted between the two fibers.

U.S. Pat. No. 6,304,083 by Owens issued Oct. 16, 2001 entitled "Magnetic field sensor with colossal magnetoresistive material contained within the coil of an oscillator" which discusses Sensors, systems and methods for measuring magnetic field strengths in both AC and DC magnetic fields by using CMR material in tunable, radio-frequency LC oscillators are disclosed.

U.S. Pat. No. 5,958,154 by O'Handley, et al. Sept. 28, 1999, entitled "High-strain, magnetic field-controlled actuator materials", which discusses Magnetically-controlled actuator materials are provided that produce large actuation stroke, that exhibit fast actuation response time and corresponding high-frequency operation, and that enable efficient actuation energy conversion at convenient operating temperatures. The actuator materials exhibit an austenitic crystal structure above a characteristic phase transformation temperature and exhibit a martensitic twinned crystal structure below the phase transformation temperature. One actuator material provided by the invention is an alloy composition that can be defined generally as (Ni.sub.a Fe.sub.b Co.sub.c) .sub.65−x−y (Mn.sub.d Fe.sub.e Co.sub.f).sub.20+x (Ga.sub.g Si.sub.h Al.sub.i).sub.15+y, where x is between about 3 atomic % and about 15 atomic % and y is between about 3 atomic % and about 12 atomic %, and where a+b+c=1, where d+e+f=1, and g+h+i=1. The actuator material is characterized by a magnetocrystalline anisotropy energy that is sufficient for enabling motion of twin boundaries of the martensitic twinned crystal structure in response to application of a magnetic field to the martensitic twinned crystal structure. This enables the material to produce an actuation stroke in response to the magnetic field. Based on this actuation mechanism, the actuator materials of the invention overcome the thermal, stroke, and frequency response limitations typically associated with actuator materials, and enable a class of actuators with large stroke and high speed at convenient temperature.

U.S. Pat. No. 5,776,359 to Schultz, et al. Jul. 7, 1998, entitled "Giant magnetoresistive cobalt oxide compounds", which discusses Methods and apparatus for the preparation and use of a substrate having an array of diverse materials in predefined regions thereon. A substrate having an array of diverse materials thereon is generally prepared by delivering components of materials to predefined regions on a substrate, and simultaneously reacting the components to form at least two materials. Materials, which can be prepared using the methods and apparatus of the present invention, include, for example, covalent network solids, ionic solids and molecular solids. More particularly, materials which can be prepared using the methods and apparatus of the present invention include, for example, inorganic materials, intermetallic materials, metal alloys, ceramic materials, organic materials, organometallic materials, non-biologicalorganic polymers, composite materials (e.g., inorganic composites, organic composites, or combinations thereof), etc. Once prepared, these materials can be screened for useful properties including, for example, electrical, thermal, mechanical, morphological, optical, magnetic, chemical, or other properties. Thus, the present invention provides methods for the parallel synthesis and analysis of novel materials having useful properties.

U.S. Pat. No. 5,446,377 to Mohri, et al. issued Aug. 29, 1995, entitled "Magnetic detector using Matteucci effect" which discusses A magnetic detector for detecting a magnetism present in the vicinity of or close to a magnetic wire circumferentially magnetized therein and an electromagnet for generating an A.C. magnetic field on the basis of the magnitude of a Matteucci-effect voltage developed across the magnetic wire when the electromagnet approaches the magnetic wire. A coordinate input device for detecting proximity between the electromagnet and an array of a plurality of such magnetic wires arranged in X and Y directions when the electromagnet approaches the array. A magnetic image sensor for detecting an intensity distribution of a static magnetic field to be detected and present along a longitudinal direction of the wire on the basis of a detection voltage of the wire when a plurality of such electromagnets arranged along the longitudinal direction of the wire are sequentially excited one after another.

U.S. Pat. No. 5,103,174 to Wandass, et al. issued Apr. 7, 1992, entitled Magnetic field sensor and device for determining the magnetostriction of a material based on a tunneling tip detector and methods of using same", which discusses a tunneling tip piezo incorporated into various devices for measuring effect of changes in environmental conditions (i.e., temperature, pressure, magnetic and electrical fields, etc) upon a material by sensing minute changes in the dimensions of the surface. The devices may be used to detect changes in environmental conditions or to determine physical properties of a material.

U.S. Pat. No. 5,073,858 to Mills, issued Dec. 17, 1991, entitled "Magnetic susceptibility imaging (MSI)," discusses Magnetic Susceptibility Imaging (MSI) comprises a generator to magnetize the tissue to be imaged, such as a first Helmholtz coil, which produces a high-strength external magnetic field to which unpaired electrons of paramagnetic molecules of tissue, which includes primarily deoxyhemoglobin and oxygen, couple in a positive sense, and to which orbital electrons of diamagnetic molecules of tissue, such as proteins and water, couple in a negative sense to produce a secondary magnetic field. The imaging system further comprises a nullifier to null the external magnetizing field, such as a second Helmholtz coil which, for example, confines the flux of both of the coils to a single plane such that the component of the secondary field perpendicular to this plane is the only field with a nonzero component. The secondary field component is detected by a detector, such as an array of Hall voltage detectors. The detection is performed over a sample space, and the signals recorded from the secondary field are used to reconstruct the magnetic susceptibility function of the body using the reconstruction processor of the present invention, such as a Fourier Transform Algorithm processor.

U.S. Pat. No. 5,039,943 to Weber, et al., issued Aug. 13, 1991, entitled "Magnetostrictive magnetometer," teaches A magnetometer which employs a rod of magnetostrictive material comprising a ternary alloy of dysprosium, terbium and iron wherein the grains of the material have their common principal axes substantially pointed along the axis of the rod. Means are provided for compressively stressing the rod in order to enhance the magnetostrictive response thereof. A laser source and photosensor are associated with a free end of the rod to function as an external cavity laser sensor. A DC magnetic bias is required for the magnetostrictive rod in order to operate in the sensitive range of the magnetostrictive characteristics of the rod. In a portable implementation of the device, the DC bias is provided by means of permanent magnets, preferably rare earth magnets, in order to provide the high bias fields compatible with high sensitivity of the material in a miniaturized portable device.

U.S. Pat. No. 5,038,103 to Scarzello, et al., issued Aug. 6, 1991, entitled "Optical fiber magnetometer," discusses An optical fiber magnetometer having omnidirectional capability is disclosed herein for measuring a total magnetic field independent of its physical orientation or the direction of the field or fields. A relatively long optical fiber defining a sensing arm for exposure to a magnetic field is wound in the form of a spheroid (like rubber bands on a golf ball or yarn threads on a baseball) to provide optical path lengths of substantially the same total length in every direction through the spheroid winding. The plane of polarization of light transmitted through the optical fiber winding is caused to rotate (Faraday effect) when the fiber or components thereof is exposed parallel to a magnetic field. The extent of plane rotation is determined, inter alia, by the total magnetic field passing through the spheroid winding.

U.S. Pat. No. 5,015,953 to Ferguson, et al., issued May 14, 1991, entitled "Magnetometer for detecting DC magnetic field variations," teaches A magnetometer for detecting variations in a DC magnetic field. The magnetometer includes a magnetic field variation sensitive device that resonates at a characteristic resonant frequency by converting energy stored therein as a result of being excited by electromagnetic radiation at twice the resonant frequency when biased by a DC magnetic bias field within a predetermined field intensity range in which the amplitude of the resonance varies with variations of the field intensity. The magnetometer further includes an excitation circuit for exciting the device to resonate at the characteristic resonant frequency at an amplitude level that remains constant when the DC magnetic bias field intensity does not vary and is within the predetermined field intensity range; a DC voltage source within the excitation circuit for biasing the device with a DC magnetic bias field that is within the predetermined field intensity range; and a sensing instrument for sensing the amplitude of the resonance of the device at the characteristic resonant frequency. A variation in the amplitude of the resonance sensed by the sensing instrument indicates a variation in the intensity of the DC magnetic bias field. The magnetometer is utilized in a variety of different systems, including a system for actuating an output instrument, such as a traffic signal controller, in response to a predetermined threshold variation in a DC magnetic bias field, such as occurs when a motor vehicle moves into the vicinity of the magnetometer; a system for probing for materials whose presence affects the intensity of a DC magnetic bias field, such as buried pipes or ferromagnetic mineral deposits; a system for communicating in the low frequency range of the electromagnetic spectrum; and a system for guiding a probe with respect to the location of an object whose presence causes a variation in the intensity of a magnetic bias field.

U.S. Pat. No. 4,951,674 to Zanakis, et al., issued Aug, 28, 1990, entitled "Biomagnetic analytical system using fiber-optic magnetic sensors," discusses A biomagnetic analytical system for sensing and indicating minute magnetic fields emanating from the brain or from any other tissue region of interest in a subject under study. The system includes a magnetic pick-up device constituted by an array of fiber-optic magnetic sensors mounted at positions distributed throughout the inner confines of a magnetic shield configured to conform generally to the head of the subject or whatever other body region is of interest. Each sensor yields a light beam whose phase or other parameter is modulated in accordance with the magnetic field emanating from the related site in the region. The modulated beam from each sensor is compared in an interferometer with a reference light beam to yield an output signal that is a function of the magnetic field being emitted at the related site. The output signals from the interferometer are processed to provide a display or recording exhibiting the pattern or map of magnetic fields resulting from emanations at the multitude of sites encompassed by the region.

U.S. Pat. No. 4,918,371 to Bobb, issued Apr. 17, 1990, entitled "Fiber optic magnetometers for multiple order gradiometers," teaches Magnetometers disposed as magnetostrictive segments on optical fiber element are incorporated in multiple order gradiometers to reduce the size, weight and cost thereof. in the preferred embodiments, such reductions are greatly enhanced by consolidating a plurality of magnetometers on individual optical fiber elements, which also serves to decrease the number of devices associated with the magnetometers in the multiple order gradiometers.

U.S. Pat. No. 4,769,599 to Mermelstein, issued Sept. 6, 1988, entitled "Magnetometer with magnetostrictive member of stress variable magnetic permeability," discusses A highly sensitive magnetometer employs a magnetostrictive amorphous metal core in which a piezoelectric driver induces stress variations. In the presence of an external magnetic field, the magnetization of the magnetostrictive core varies in relation to the induced stress. The amplitude of the variations in magnetization is proportional to the strength of the external field and is sensed by a pick-up winding disposed around the magnetostrictive core. The dynamic range of the device is improved by employing a bucking field winding around the core to null out the magnetization of the core. In contrast to the inherent non-linear characteristic of the conventional fluxgate magnetometer, the invention inherently provides a linear response to magnetic field strength.

U.S. Pat. No. 4,712,065 to Pitt, et al., issued Dec. 8, 1987, entitled "Magnetic field sensors, in particular optical fiber magnetometers," teaches In a fiber optic interferometric magnetic sensor or magnetic gradient detector a magnetic bias field is applied to a magnetically sensitized portion of an optical fiber by means which are driven by optical power whereby a completely passive sensor head arrangement may be achieved. In a magnetic gradient detector optical power from a high power laser (34) may be supplied via an optical fiber (35) to illuminate a solar cell 27 to whose electrical output terminals solenoids (25,26) are connected. A portion of a respective optical fiber (21, 22), which is magnetically sensitized, by for example bonding to a strip of magnetostrictive material (23, 24), is disposed inside each solenoid (25, 26).

U.S. Pat. No. 4,675,522 to Arunkumar issued Jun. 23, 1987, entitled "Fiber optic magnetic field sensor," teaches The present invention provides an improved fiber optic magnetometer having particular application for use in environments having large magnetic field ranges and gradients, such as space based applications. The magnetometer includes a laser, which generates a coherent beam of light, which is split by a beam splitter into first and second beams. The first beam is passed through a single mode fiber optic having a short metallic conductor attached to it. This fiber is referred to as the "sensor arm" of the magnetometer. The second beam is passed through another single mode fiber, which is wrapped around a modulator that is coupled to a feedback circuit. This adjusts the magnetometer such that ambient system noise is filtered and the device is maintained at maximum sensitivity. The output of the two fibers is combined forming a Mach-Zehnder interferometer. A current I is passed through the conductor in the sensor arm. If this fiber is in the vicinity of a magnetic field, displacement of the current carrying conductor will cause the fiber to bow. The resulting stretching of the fiber increases the path length for the light beam traversing through the sensor arm. The subsequent phase change measured by the Mach-Zehnder is related to the force exerted by the magnetic field on the conductor. The direction in which the fiber bows is dependent upon the magnetic field direction. The present invention also discloses an improved modulator for maintaining the present invention at the point of optimum operation.

U.S. Pat. No. 4,587,487 to Zanzucchi, issued May 6, 1986, entitled "Optical fiber magnetometer for measuring D.C. and low frequency fields," discusses An optical fiber magnetometer employing balanced magnetostrictive oscillations to measure D.C. and low frequency ambient magnetic fields. The magnetometer includes an optical fiber interferometer 18 having a laser beam input 10 for travel through first and second arms 14, 16 of the interferometer. First and second magnetostrictive rods 20, 22 forming a matched pair are coupled to the respective optical fibers in the first and second interferometer arms 14, 16. An applied oscillating magnetic field is applied to each of the rods 180 degree, out of phase. The D.C. or low magnetic field to be measured, when combined with each of the applied fields, induces a change in the path length of each of the interferometer arms. The difference in the change in path length of each of the interferometer arms is determined to develop a signal representative of the D.C. to low frequency ambient magnetic field.

U.S. Pat. No. 4,516,021 to Taylor, issued May 7, 1985, entitled "Fiber optic magnetic field sensor," teaches An optical fiber magnetometer utilizing, in one embodiment, a birefringment optical fiber in combination with a magnetostrictive block for inducing strains in the fiber in response to an applied magnetic field to thereby cause a change in the degree of birefringence of the fiber. This change in birefringence is measured by directing the light exiting the fiber through a conversion element such as a polarizer or a prism and then detecting the resulting intensity modulation in a photodetector. A variety of inventive features are set out in this disclosure including the use of spliced fibers with a 90 degree axis rotation to compensate for environmental effects, the use of a twisted fiber for gradient field sensing, and the rotation of the sensor fiber to eliminate low-frequency noise and to obtain a vector field and field gradient sensing capability.

U.S. Pat. No. 4,037,149 to Foner, issued Jul. 19, 1977, entitled "Multiple mode magnetometers," discusses A magnetometer in which at least two modes of drive are employed in exciting sensor and/or sample so that the sensor provides an output indication of magnetic moment, which is a function of both drive modes. The drive modes may be periodic at specific driving frequencies, a periodic or may comprise a unidirectional portion of a mode. The output of the sensor contains components representative of the frequency or frequencies of the first mode modulated at the frequency or frequencies of the second mode. This sensor output is then analyzed to provide an indication of sample magnetic moment as a function of the frequency components of both modes of drive in order to eliminate contributions to the indicated magnetic moment from background signals or other perturbations, which may be present under, single mode operation. The multiple mode magnetometer is useful in several embodiments for production line applications, investigations of magnetic properties of inhomogeneous magnetic materials, as well as for general magnetic moment measurements. The concept of a multimode magnetometer also may be extended to include a multiplicity of modes.

U.S. Pat. No. 4,471,219 to Giallorenzi, issued Sept. 11, 1984, entitled "Amplitude mode magnetic sensors," teaches A magnetic field sensor for detecting a magnetic field perturbation while nulling out variations in the signal caused by acoustic perturbations comprising a first and second optical fibers, an adjustable optical coupler for coupling light there between, a magnetic component attached to the optical coupler for exerting a mechanical force thereon proportional to a magnetic field perturbation to thereby change the degree of coupling between the fibers, and an optical detector for determining the amount of light actually being coupled between the fibers. As noted above, the system includes an acoustic circuit for nulling out the response in the detector signal due to acoustic perturbations. Two separate embodiments are disclosed. A first embodiment modulates the axial alignment of fibers in an end-to-end configuration by means of a magnetic material. A second embodiment modulates the evanescent coupling between the fibers disposed in parallel adjacency via a magnetostrictive material.

U.S. Pat. No. 4,656,421 to Ellis, et al., issued Apr. 7, 1987, entitled "Magnetic field sensors," discusses A magnetic field sensor in the form of an element comprising two superimposed strips of material is described. The magnetostrictive constant along the longitudinal axis of one of the strips is greater than that of the other strip, the latter strip carrying at each end a post. In use of the sensor a single mode optical fiber is attached to the element via the posts such that the part of the fiber between the posts extends along a chord of the arc defined by the element. A variation in applied magnetic field in the plane containing the arc gives rise to a variation in the part of the fiber between the posts. Light passing through the fiber is thus phase shifted by an amount dependent on the value of the applied magnetic field.

U.S. Pat. No. 6,279,406 to Li, et al., issued Aug. 28, 2001, entitled "Passive solid-state magnetic field sensors and applications therefore," teaches Passive solid-state magnetic sensors are based on the combination of magnetorestrictive materials and piezoelectric materials. Sensors have applications in rotor speed detection, magnetic field detection, read heads, and MRAM, for example.

U.S. Pat. No. 6,281,976 to Taylor, et al., issued Aug. 28, 2001, entitled Fiber optic fiber Fabry-Perot interferometer diaphragm sensor and method of measurement, A fiber optic fiber Fabry-Perot interferometer diaphragm sensor and method of measurement is provided. A fiber Fabry-Perot interferometer diaphragm sensor includes a base and a diaphragm with an optic fiber coupled under tension between the base and the diaphragm. A fiber Fabry-Perot interferometer element.(40) is contained within the optic fiber and operates to sense movement of the diaphragm. In a particular embodiment, the diaphragm moves in response to a pressure (P) applied to the diaphragm . In another embodiment, a proof mass is coupled to the diaphragm such that the diaphragm moves in response to an acceleration. In yet another embodiment, a magnetic body is coupled to the diaphragm such that the diaphragm moves in response to a magnetic field .

U.S. Pat. No. 5,982,174 to Wagreich, et al., issued Nov. 9, 1999, entitled "External cavity fiber Fabry-Perot magnetometer," A magnetometer uses a material exhibiting the Faraday effect, in which the polarization of light transmitted through the material is changed in response to a magnetic field. When the material is placed in a Fabry-Perot cavity, multiple reflections of the light within the Fabry-Perot cavity increase the change in polarization and thus the sensitivity of the magnetometer. Other effects that alter the polarization of light can be employed instead.

U.S. Pat. No. 5,736,856 to Oliver, et al., issued Apr. 7, 1998, entitled "Method and apparatus for performing magnetic field measurements using magneto-optic Kerr effect sensors," teaches A sensor system includes a magneto-optic Kerr effect magnetic field sensing element and an optical system including a light source, at least one polarizer or polarizing element and a detector disposed about the sensing element. The sensing element is responsive to an external magnetic field. In one embodiment, the optical system and sensing element can be arranged to measure the strength of a magnetic field. In another embodiment the optical system and sensing element can be arranged to measure the rotational speed of rotating members.

U.S. Pat. No. 5,471,139 to Zadoff, issued Nov. 28, 1995, entitled "Fiber optic line magnetometer having thermal compensation," discusses A fiber optic line magnetometer is used in a railway block detection system for detecting the presence of a train, or a portion of a train, within a predetermined block. The fiber optic line magnetometer is positioned in the center of the tracks and runs parallel to the tracks for the entire length of the block. The fiber optic line magnetometer includes a sense arm and a reference arm, each of which includes a fiber optic cable for carrying a light originating from a signal source. Magnetostrictive elements connect to the fiber optic cable in the sense arm and change the light path length when external magnetic fields are applied thereto. The light exiting from the sense arm and the reference arm are compared, and in the event the fringe shifts in the compared light exceeds predetermined thresholds, a detection control signal is generated. Non-magnetostrictive elements, which are sized to have the same thermal temperature expansion characteristics as the magnetostrictive elements, are attached to the fiber optic cable of the reference arm.

U.S. Pat. No. 4,609,871 to Bobb, issued Sept. 2, 1986, entitled "Temperature compensated optical fiber interferometric magnetometer," teaches Temperature compensation of an optical fiber interferometer is achieved by wrapping and bonding one fiber arm transversely about the length of a magnetostrictive rod which is sensitive only to the magnetic field component along its length. The other fiber arm is wrapped and bonded about two generally semicircular caps, attached to either end of therod, in a direction along the longitudinal axis of the rod.

U.S. Pat. No. 4,600,885 to Koo, et al., issued Jul. 15, 1986, entitled "Fiber optic magnetometer for detecting DC magnetic fields," teaches A fiber optic magnetometer for detecting DC magnetic fields includes a first optical fiber having a magnetostrictive jacket thereon which defines a sensing arm, and a second fiber defining a reference arm. An AC magnetic field of frequency $\omega_0$ and constant amplitude is imposed on the magnetostrictive jacket so as to cause a time varying optical path length change, having an $\omega_0$ component, in the sensing arm fiber. This induces a corresponding time varying phase shift, also having an $\omega_0$ component, in light transmitted through the sensing arm fiber, which is detected by a phase detector. The phase detector produces a signal proportional to the phase shift, this signal being passed to a lock-in amplifier set to amplify at $\omega_0$. The lock-in amplifier produces an output signal proportional to the amplitude of the $\omega_0$ component, wherein this amplitude is proportional to any DC magnetic fields to which the device is exposed.

U.S. Pat. No. 4,665,363 to Extance, et al., issued May 12,1987, entitled "Optical fiber magnetic gradient detector," Two portions (B,C) of one arm of an optical fiber Mach-Zehnder interferometer are magnetically sensitized and each has applied thereto an a.c. bias fields at a respective different frequency (w.sub.1, w.sub.2). One portion (A) of the other arm of the interferometer is magnetically sensitized and has two a.c. bias fields applied thereto, each at one of the different frequencies (w.sub.1, w.sub.2). The fields for portion A and C are aligned with a first direction (x) whereas those for A and B are parallel, A and B being separated in a second direction (y). The detected output of the interferometer at frequency w.sub.1 is related to the magnetic gradient in the y direction, whereas the detected output at frequency w.sub.2 is related to the magnetic gradient in the x direction. Thus using two bias frequencies allows one interferometer to be used to detect two gradients.

Therefore it appears that based on the prior art just reported there are no identical devices existing in the prior art that are smart in the sense of the proposed invention. The proposed invention is neither SQUID-based nor based on any optical effects such as Fabry-Perot interferometery or other types of fiber optic interferometry.

Accordingly, it is an object of this invention to provide a smart and improved magnetic sensors that can selectively filter out magnetic fields or variations there of greater or smaller than a certain critical value.

SUMMARY OF INVENTION

Briefly, the said invention discusses a smart magnetometer which includes a cantilevered magnetostrictive/optical fiber bonded structural composite in a vibrationally isolated housing allowing an optical signal to be transmitted and detected from one optical fiber to another such that fluctuations of the surrounding magnetic field H will cause fluctuating mechanical torque on the bonded magnetostrictive beam which will be applied to the bonded cantilevered optical fiber to deflect or misalign and cause modulation of the said optical signal transmitted between the two fibers. This modulation can be calibrated to the dynamic variation of strength of a neighboring magnetic field to a precision of less than 1 fTe and sensitivity of 1 fTe/sqrtHz. The system is smart to selectively filter out any neighboring magnetic field with average strength smaller or greater than a certain critical value. The system is also smart enough to switch from one magnetic field average strength and/or direction to another with different average strength and/or direction.

Because of the high precision and sensitivity of the said magnetometer, its use in detecting weak magnetic fields emanating from biological tissues, organs, heart and brain presents a great potential for medical imaging.

BRIEF DESCRIPTION OF DRAWINGS

The said invention as described above with its other features and objects will become more apparent by reference to the following descriptive Figures in conjunction with the accompanying drawings, in which:

FIG. 4 depicts a cantilevered composite magnetostrictive/optical fiber configuration of the magnetometer.

DETAILED DESCRIPTION

Figure 1:
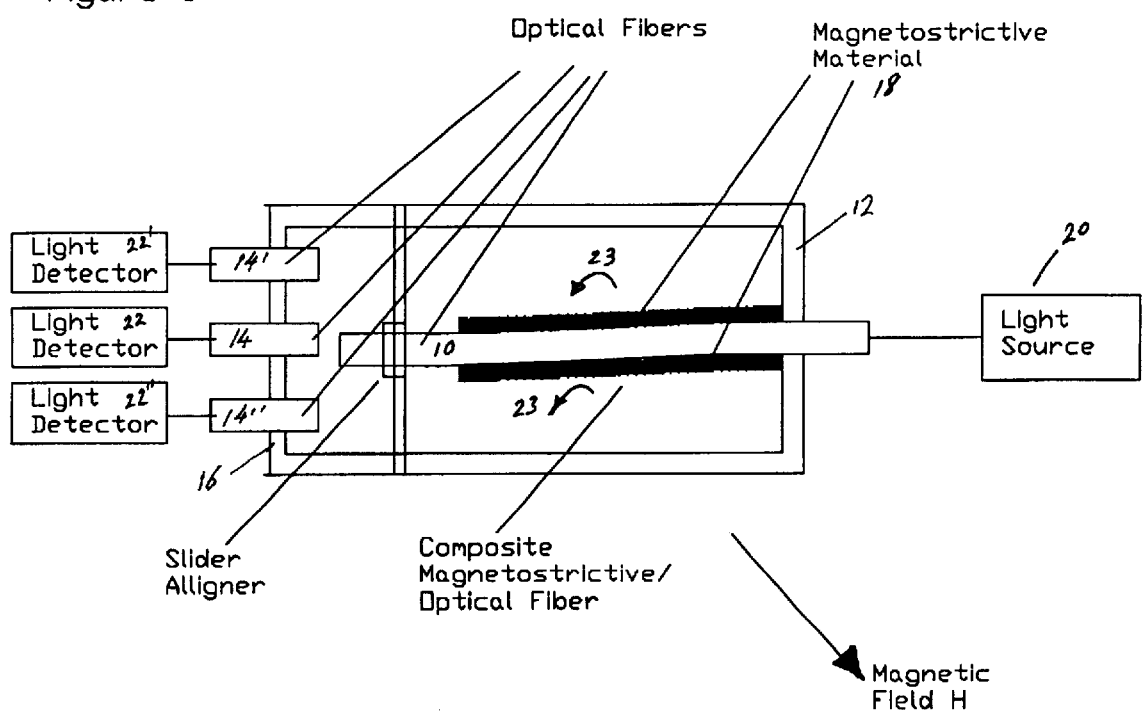
FIG. 1 is an illustration of the proposed smart fiber optic magnetometer.

Referring now to FIG. 1 of the drawings, there is illustrated thereby a first embodiment of the invention for a smart fiber optic magnetic sensor and in particular, a magnetometer. The principal components of the smart fiber optic magnetometer include a first bonded structural composite of a magnetostrictive material such as Metglas, Terfenol-D or giant magnetostrictive alloys (magnetic shape memory alloys) such as different alloys of NiMnGa (see U.S. Pat. No. 5,958,154 by O'Handley, et al. Sept. 28, 1999, entitled "High-strain, magnetic field-controlled actuator materials", which discusses Magnetically-controlled actuator materials are provided that produce large actuation stroke, that exhibit fast actuation response time and corresponding high-frequency operation, and that enable efficient actuation energy conversion at convenient operating temperatures) bonded to an optical fiber disposed within a support 12 so as to remain stationary and a second optical fiber 14 fixed to a support 16 but extending therefrom to form a cantilevered beam.

The bonded composite cantilevered beam is a bonded structural composite as shown in FIG. 4 such that a single or a multi-mode optical fiber 10 is tightly bonded to a magnetosrictive material such as a Terfenol-D beam 18 having a magnetic moment along the longitudinal axis of the optical fiber 10. For certain applications the magnetic moment may be normal to fiber 10. The optical fibers 10 and 14 may be axially aligned, so that any offset, which may be on the order of 50% of the fiber-core diameter, will provide maximum change in optical coupling between the two fibers with small bending displacement of the composite cantilevered optical fiber 10 in the direction of the offset. Also note that in FIG. 4 one may use a number of segmented magnetostrictive beams bonded to the optical fiber 10 in order to generate any desired bending of the fiber.

A source of light is applied to one end of the fibers 10, for example by applying the output of a light source 20, as for example a laser diode or LED to fiber 10. The light is detected at the end of the other fiber, in this case fiber 14, by a detector 22 such as a photodiode. The term light includes both the visible and invisible and includes all wavelengths, which can be transmitted by the optical fibers.

Figure 2:
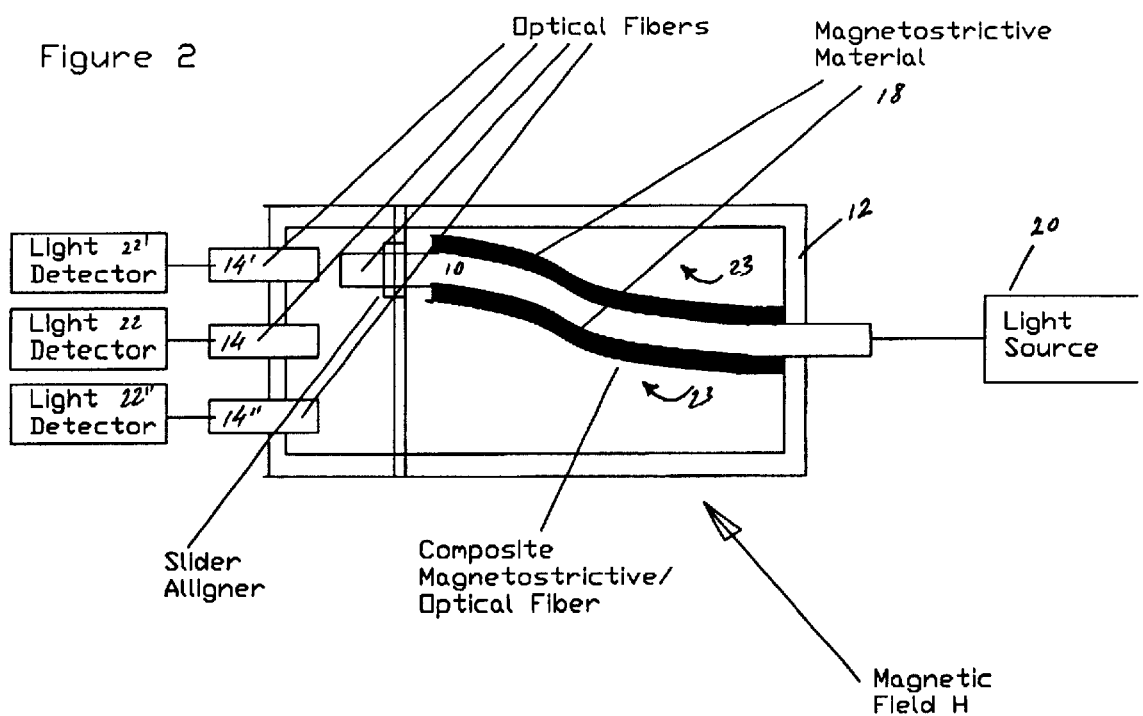
FIG. 2 illustrates how the selectivity of the magnetometer is changed for stronger magnetic fields by switching to another outgoing fiber.
Figure 3:
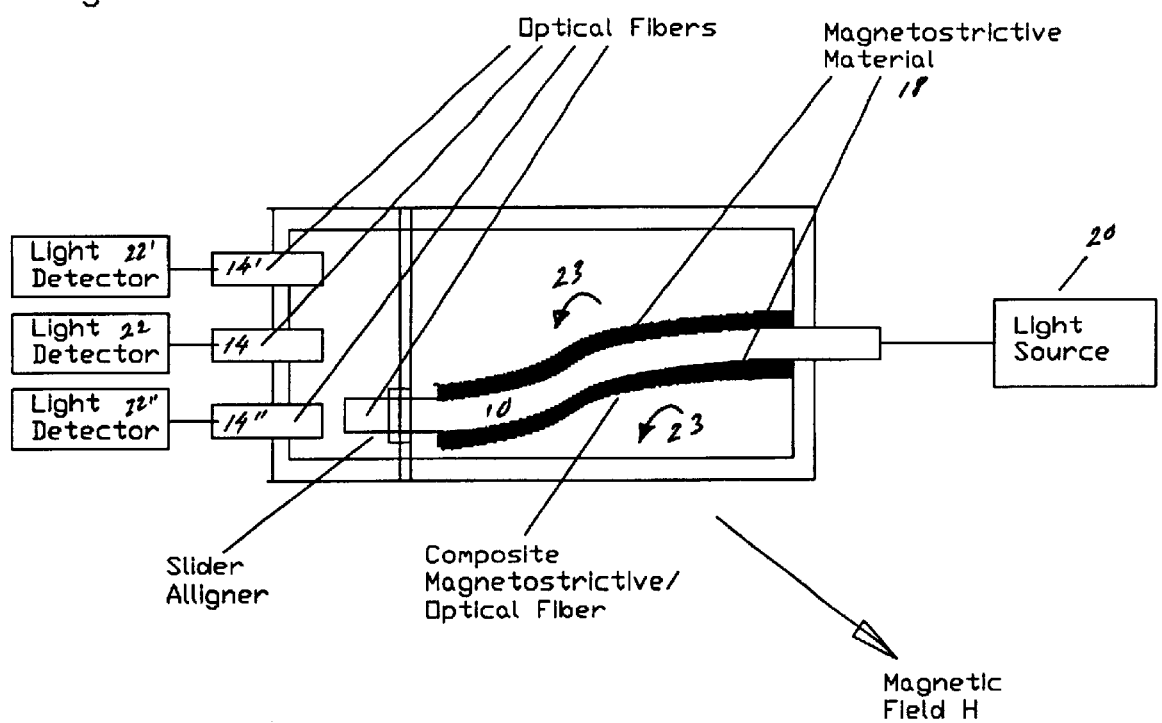
FIG. 3 is an illustration of another embodiment of FIG. 2 with the stronger magnetic field changing direction.

Fluctuations of the magnetic H field, which is transverse to the longitudinal axis of the bonded composite magnetostrictive/optical fiber cantilevered beam 18, will cause fluctuating mechanical torque on the composite beam 18, as indicated by the arrow 23, as shown in FIGS. 1, 2 and 3 which will be applied to the primary optical fiber 10 to which it is attached. Deflection of the composite cantilevered beam/optical fiber 110 will produce fluctuational coupled light from optical fiber 10 to optical fiber 14 with such fluctuations being proportional to the applied magnetic field.

The selectivity and filtering out smartness of the said magnetometer employing the additional two fibers 14' and 14" is illustrated in FIGS. 2 and 3. IN these configurations the presence of a stronger magnetic field and different field directions causes the light coupling and modulation to shift to other outgoing optical fibers 14' and 14" by larger deflections of the composite magnetostrictive/optical fiber 10.

In order to calculate the possible precision and sensitivity of such smart magnetometers consider the giant magnetostrictor of the magnetic shape memory kind NiMnGa with typical magnetic striction rate of 10,00 ppm/Oe in the form of a rod of length 10 mm, and 0.1 mm×0.1 mm square cross section bonded axially and eccentrically to an optical fiber in a cantilever form. In this configuration (FIG. 4) any axial magnetic striction of the Terfenol-D will cause the composite cantilever optical fiber to bend and cause a tip deflection and subsequent misalignment of the incoming and outgoing fibers and thus changes in the light transmitted. It is well known that possible tip motions that can still be sensed by the light detector is approximately equal to $\delta=10^{-8}$ microns. With a beam height of about 0.1 mm and length of 10 mm the strain required is $\epsilon=h\ \delta/l^2=10^{-14}$. Now, for a modest magnetostrictive rate of strain per strength of magnetic field of 1000 ppm /Oe or 1000 ppm per $10^{11}$ femto Tesla, or $10^{-14}$/fTe., one obtains a precision of less than 1 femto Tesla. This sample calculation shows the high sensitivity obtainable with the device.

While specific embodiments of a smart magnetometer have been described by FIGS. 1 through 4, it is to be understood that the embodiments shown are illustrative only, and that many variations and modifications and, in particular, microelectromechanical systems (MEMS) design variation and embodiment of the said invention may be made without departing from the principles of the invention herein disclosed and deferred by the appended claims.

What is claimed is:

1. A smart magnetometer, comprising: a first bonded structural composite of a magnetostrictive material and an optical fiber which is either single or multimode, said first composite magnetostrictive/optical fiber being arranged as a cantilevered beam inside a housing, a number of secondary optical fibers spaced from said first optical fiber so as to produce a gap between the ends thereof, such that the optical coupling between said optical fibers varies proportionally to the average strength, direction and fluctuations of a component of the magnetic field substantially transverse to the longitudinal axes of said composite magnetostrictive/optical fiber cantilevered beam which causes a fluctuating magnetic moment on said first composite magnetostrictive/optical fiber beam.

2. The smart magnetometer of claim 1 wherein the second fibers are spaced apart such that the average strength, direction and fluctuations of the surrounding magnetic field will dictate how the first bonded composite magnetostrictive/optical fiber beam will align with any of the outgoing secondary optical fibers.

3. The smart magnetometer of claim 1 further including means for applying light to said first composite optical fiber and means coupled to said secondary optical fibers to detect the amount of light transmitted from said first composite optical fiber to said second optical fibers.

4. The smart magnetometer of claim 1 involving magnetic imaging of biological tissues, organs, heart and brain.

5. The smart magnetometer of claim 1 involving magnetic measurements and imaging of non-biological materials.

6. The smart magnetometer of claim, 1 involving selective discrimination between various strength magnetic fields.

7. The smart magnetometer of claim 1 which uses a number of segmented magnetostrictive beams bonded to the optical fiber in order to generate any desired bending of the fiber.

8. The smart magnetometer of claim 1 in which the smart magnetometer is distributed in an array form.

9. A smart magnetic sensor, comprising: a first bonded composite magnetostrictive/optical fiber and said first composite optical fiber arranged as a composite cantilevered beam, a second set of optical fibers spaced from said first optical fiber so as to produce a gap between the ends thereof, such that the optical coupling between said optical fibers varies proportionally to fluctuations of a varying component of the magnetic field substantially transverse to the longitudinal axes of said composite magnetostrictive/optical fiber cantilevered beam which causes fluctuating magnetic torque on said magnetostrictive/optical fiber and such that depending on the average strength, direction and fluctuation of the surrounding magnetic field different outgoing fibers will be engaged by optical coupling with the first bonded composite magnetostrictive/optical fiber beam.

10. The smart magnetic sensor of claim 9 involving magnetic imaging of biological tissues, organs, heart and brain.

11. The smart magnetic sensor of claim 9 involving magnetic measurements and imaging of non-biological materials.

12. The smart magnetic sensor of claim 9 involving selective discrimination between various strength magnetic fields.

13. The smart magnetic sensor of claim 9 which uses a number of segmented magnetostrictive beams bonded to the optical fiber in order to generate any desired bending of the fiber.

14. The smart magnetic sensor of claim 9 in which the smart magnetic sensor is distributed in an array form.

* * * * *